US006587060B1

(12) United States Patent
Abbey

(10) Patent No.: US 6,587,060 B1
(45) Date of Patent: Jul. 1, 2003

(54) MULTI-BIT MONOTONIC QUANTIZER AND LINEARIZED DELTA-SIGMA MODULATOR BASED ANALOG-TO-DIGITAL AND DIGITAL-TO ANALOG CONVERSION

(76) Inventor: Duane L. Abbey, 3715 Elmwood Dr. NE., Cedar Rapids, IA (US) 52402

( * ) Notice: Subject to any disclaimer, the term of this patent is extended or adjusted under 35 U.S.C. 154(b) by 0 days.

(21) Appl. No.: 09/383,305

(22) Filed: Aug. 26, 1999

(51) Int. Cl.[7] .......................... H03M 3/00; H03M 1/66; H03M 1/12
(52) U.S. Cl. ...................... 341/143; 341/144; 341/155
(58) Field of Search .............................. 341/143, 145, 341/155

(56) References Cited

U.S. PATENT DOCUMENTS

| | | | | |
|---|---|---|---|---|
| 5,245,343 A | * | 9/1993 | Greenwood et al. | 341/143 |
| 6,061,008 A | * | 5/2000 | Abbey | 341/143 |
| 6,124,813 A | * | 9/2000 | Robertson et al | 341/143 |
| 6,188,345 B1 | * | 2/2001 | McDonald et al. | 341/143 |
| 6,229,466 B1 | * | 5/2001 | Gattani | 341/120 |
| 6,326,912 B1 | * | 12/2001 | Fujimori | 341/110 |
| 6,373,418 B1 | * | 4/2002 | Abbey | 341/143 |

\* cited by examiner

*Primary Examiner*—Peguy JeanPierre
*Assistant Examiner*—Jean Bruner JeanGlaude

(57) ABSTRACT

Multi-bit, monotonic quantizer and linearized delta-sigma modulator based analog-to-digital converter (ADC) modulators and digital-to-analog converter (DAC) modulators are disclosed. A folded monotonic quantizer provides tri-state to bi-state mapping such that three state bits may be utilized but are not required to be transported and stored. The multi-bit ADC and DAC modulators provide linearized, spurious free outputs that require less power and utilize lower oversampling ratios to provide wider bandwidths at high-performance, spurious-free dynamic ranges, making them ideally suitable for use in direct sampling receivers and direct digital transmitters.

20 Claims, 5 Drawing Sheets

US 6,587,060 B1

MULTI-BIT MONOTONIC QUANTIZER AND LINEARIZED DELTA-SIGMA MODULATOR BASED ANALOG-TO-DIGITAL AND DIGITAL-TO ANALOG CONVERSION

FIELD OF THE INVENTION

The present invention generally relates to the field of data converters, and particularly to multi-bit, high performance analog-to-digital and digital-to-analog conversion.

BACKGROUND OF THE INVENTION

Delta-sigma modular architectures for analog-to-digital converters (ADCs) and digital-to-analog converters (DACs) based on continuous-time and switched capacitor integration are well known in the art. These architectures typically are for one bit or more modulators, one bit being the most common since the quantizers and DACs in the modulators are inherently more linear for one bit. The one bit minimizes the major sources of distortion generation in the modulator and therefore allows for high levels of spurious free dynamic range. However, a high-performance modulator of order two or more integrator stages is only conditionally stable and must incorporate substantial performance loss to maintain stability. This is especially true for the one bit modulator, since the two state output cannot instantaneously track the continuous, band limited (filtered) input signal. It is only over the band limited longer term that the output tracks the input precisely. If, on the other hand, multi-bit modulators are used, the output quantization noise level is lower to begin with, and the instantaneous output is able to more closely track with the input. This closer tracking equates to less performance loss that must be incorporated into multi-stage modulators to maintain stability. In fact, most two stage multi-bit modulators do not have to purposely add loss in order to achieve stability since sufficient loss in the actual circuit is already present. Therefore, multi-bit modulators would be the best approach for high-performance ADCs and DACs were it not for the difficulty in maintaining linearity so as to maintain the desired high level of spurious free dynamic range. Since multi-bit modulators are much more efficient in suppressing in-band noise, the oversampling ratio (sampling rate divided by twice the resolution bandwidth) can be lower, which generally equates to lower power required and/or less costly parts. It would therefore be highly desirable to provide a high-performance, multi-bit ADC or DAC modulator that provides good linearity and high spurious free dynamic range.

SUMMARY OF THE INVENTION

The present invention provides a means for acquiring and maintaining linearity in high-performance ADCs and DACs. Thus, the present invention is directed to an analog-to-digital converter. In one embodiment, the delta-sigma analog-to-digital converter modulator includes a means for modulating an analog input signal, a means for quantizing an output received from the modulating means to a three state digital code, a means for mapping an output of the quantizing means from a three state digital code to a two state digital code, a means for delaying and reordering the two state digital code output by a predetermined or random means, a means for inverse mapping the reordered two state digital code to a three state digital code, and a means for converting the resultant three state digital code to an analog signal which is connected back to the modulating means. The analog-to-digital converter thus formed is capable of converting an analog input signal to a two state digital output code with a predetermined number of bits of resolution.

The present invention is further directed to a digital-to-analog converter. In one embodiment, the delta-sigma digital-to-analog converter modulator includes a means for modulating a digital input signal being represented by a predetermined number of bits, a means for mapping an output of the modulating means from a two state signal to a three state digital code, one means per bit of the three state digital code output for converting each bit to an analog signal, and a combiner and reconstruction filter means for combining the analog signals. The digital-to-analog converter thus formed is capable of converting a digital input signal to an analog output signal at the output of the reconstruction filter means.

It is to be understood that both the foregoing general description and the following detailed description are exemplary and explanatory only and are not restrictive of the invention as claimed.

The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiment of the invention, an example of which is illustrated in the accompanying drawings.

Figure 1:
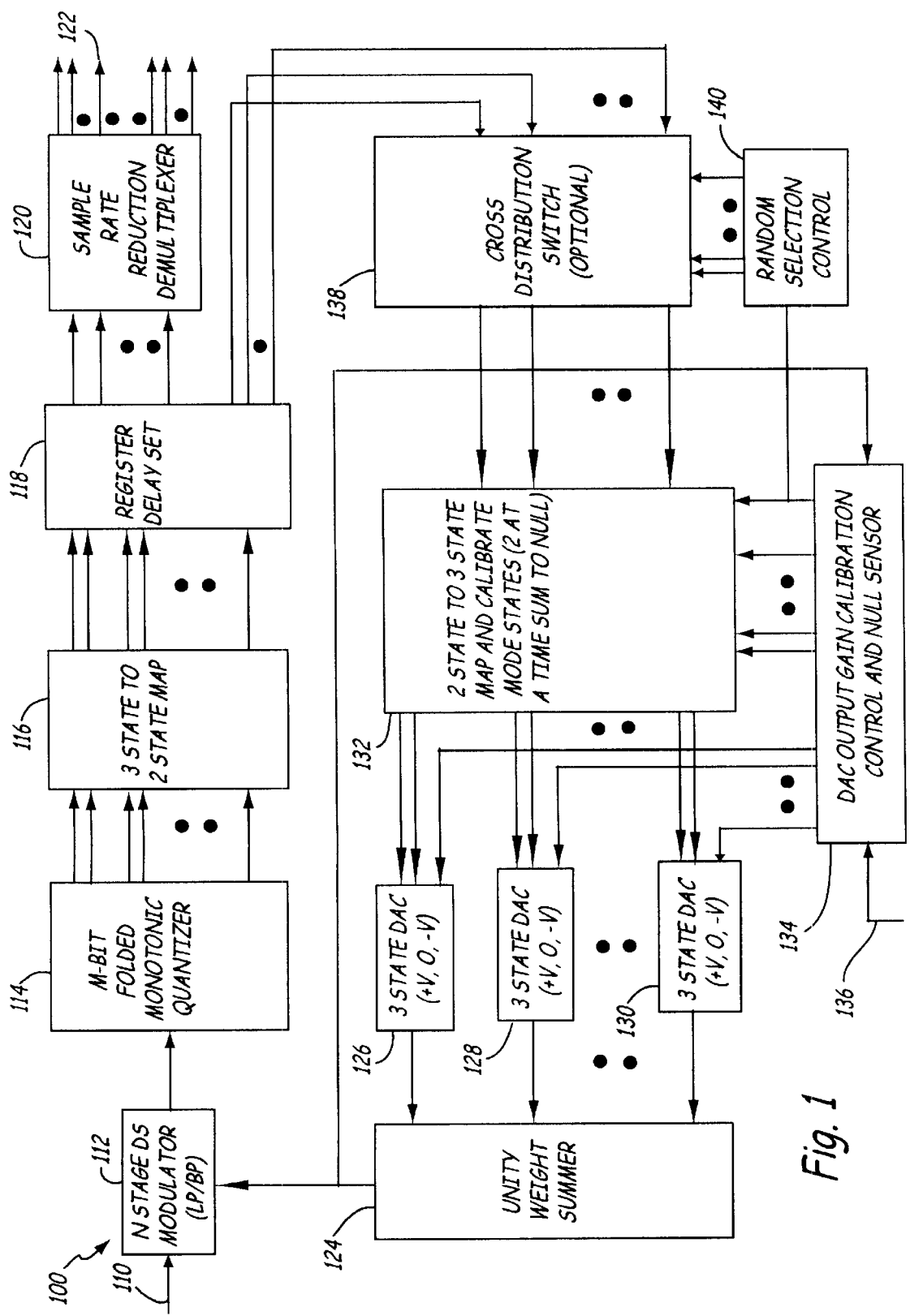
FIG. 1 is a block diagram of a multi-bit delta-sigma analog-to-digital converter (ADC) modulator in accordance with the present invention.

Referring now to FIG. 1, a block diagram of a multi-bit delta-sigma analog-to-digital converter (ADC) modulator in accordance with the present invention will be discussed. ADC modulator 100 receives an analog input signal at input 110 to be converted into a digital signal representative of the analog input. A monotonic quantizer 114 is combined with one or more three-state DACs 126, 128 and 130 (one three-state DAC per bit), and the additional functional blocks to form a complete high performance multi-bit delta-sigma ADC modulator 100. By using an oversampling, noise shaping delta-sigma modulator 112, 2 to 16 monotonic bits (2 to 5 binary bit equivalents) can perform, depending on the over-sampling ratio and the number of modulator stages, the equivalent of approximately 12 to 24 binary bits of resolution (after digital filtering to suppress the out of band noise and decimation to establish the desired bits of resolution).

ADC modulator 100 consists of an N-stage delta-sigma (low pass or bandpass) modulator filter 112 driving a folded M-bit quantizer 114, the output of which has three states per bit and is mapped to M two state bits with 3 state to 2 state map 116. After delaying the bit set by one clock delay by register delay set 118, the resampled bits are ready to be sent to a suitable digital signal decimation circuit to recover the desired binary bits of resolution and reduce the output sample rate. Sample rate reduction demultiplexer circuit 120 may be optionally utilized prior to decimation filtering to reduce the data output bus rate at modulator output 122 (serial-to-parallel bit set regrouper). This function would accommodate slower, parallel processed decimation filters that are not capable of processing the output data directly at the serial sample output rate.

A feedback signal is formed by mapping the two state bit output data from register delay set back to 3 state bit groups with 2 state to 3 state map 132 and applying a three state DAC 126, 128 and 130 to each bit (one DAC per bit). The analog output of each of DACs 126–130 is either +V, –V, or off (ground), depending upon the corresponding input data states. All bits are of equal weighting and can be combined by simply summing the outputs of DACs 126–130 with summer 124. In order for the noise and distortion in the data output of ADC modulator 100 to be minimized, the outputs of DACs 126–130 are preferably identical in span, and summer 124 preferably provides equal unity weight for each bit. Thus, summer 124 is preferably a unity weight summer. To compensate for mismatches, a calibrate on demand mode may be provided whereby the data into DACs 126–130 can be set to known patterns that result in null conditions (ground) in the summed output provided by summer 124. The individual values of +V and –V output levels of each of DACs 126–130 may be adjusted with DAC output gain calibration controller 134 to establish the desired balance between the bits. The DAC output gain calibration controller 134 determines desired DAC outputs by observation of null conditions at the output of unity weight summer 124. The calibration process balances out both DAC and summing input imbalances. Calibration mode may be controlled with a calibration mode input 136. If there is still undesired imbalance between the bits, precluding meeting the desired level of linearity, this small remaining imbalance can be randomized and distributed equally over all the bits. This is done with an optional cross distribution switch set 138 shown, which randomly scrambles the bits in the feedback with random selection controller 140 and converts non-linearity residue to a slight increase in the output noise floor of ADC modulator 100.

Figure 2:
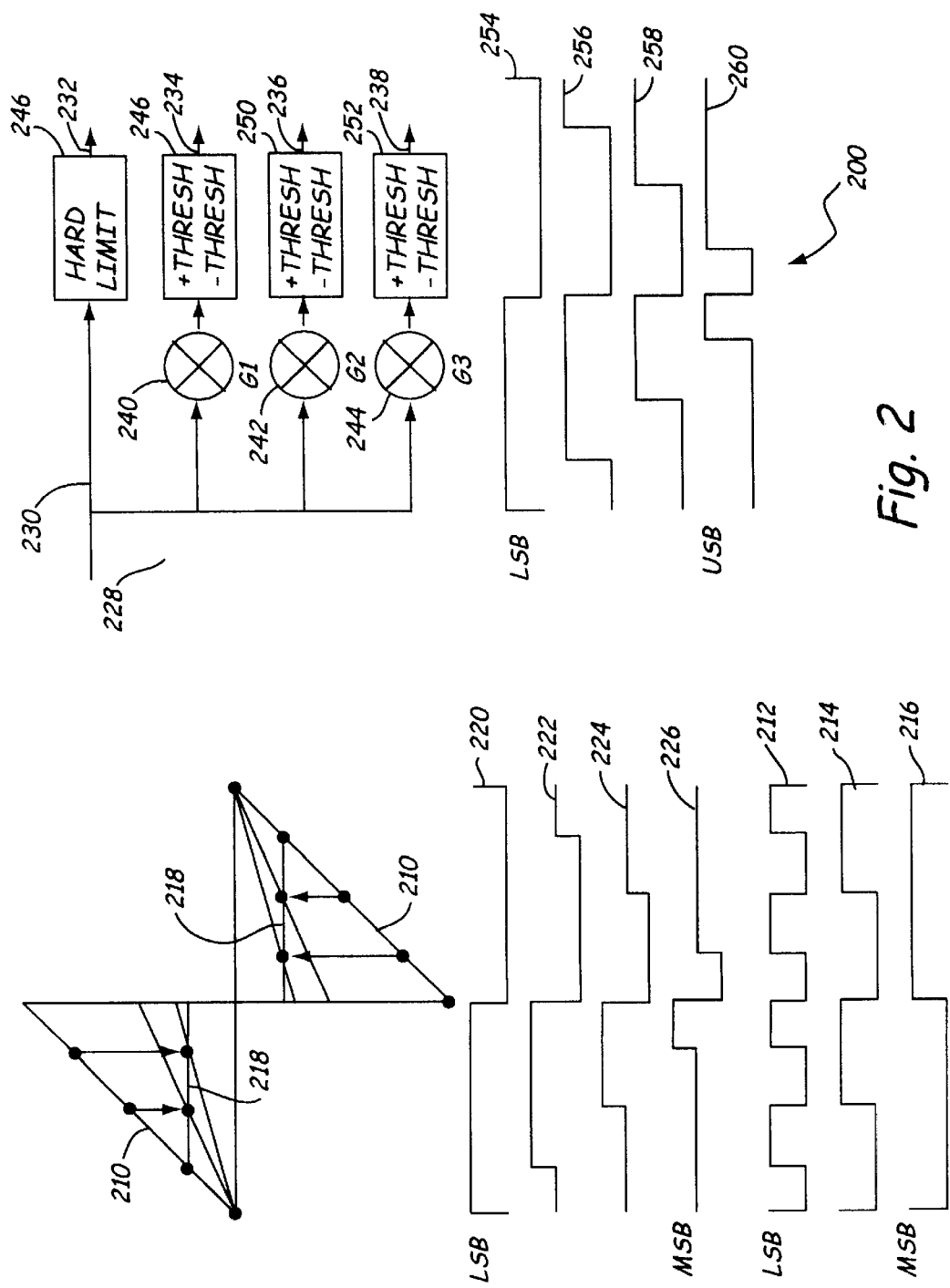
FIG. 2 is a diagram of a monotonic quantizer capable of being utilized as an element of the ADC modulator of FIG. 1 in accordance with the present invention.

Referring now to FIG. 2, a diagram of the monotonic quantizer of the ADC modulator of FIG. 1 shown by way of example will be discussed. A graphical representation is shown of the relationship of a 3-bit code and the quantized analog signal levels for the case where quantizer 114 is a 3-bit, two's complement quantizer 210. The corresponding bit output signals for two's complement quantizer 210 are represented by bit signals 212, 214 and 216. Although the code is a very efficient use of the 3 bits (describing 8 states), the code is not a monotonic progression away from zero. The least significant bit (LSB) 212, for example, changes state with each successive quantizer state change. This means that the bits must be treated as a group and therefore the threshold points on the analog signal must be precisely positioned for equal values between states. The bits are not capable of being considered separately so as to linearize each bit by itself (each bit having two active states). Further, there is more than one bit changing state at a time which leads to erroneous transient output states when all bits do not transition at precisely the same time.

One common way of implementing a two's complement quantizer is by using a "thermometer code" output stack of comparators and a thermometer code to two's complement code converter. This ADC approach is commonly called a "flash ADC converter". Because the output is a binary code, the relationship between the code states and the voltage thresholds that produced the thermometer code must be precise and uniform or non-linearity produced distortion in the two's complement output will result. This means that the thresholds used in the thermometer code must be the same incremental voltage apart. If the code converter were left off and just the thermometer code output were used, the code can be considered as a single sided monotonic code formed from two state bits (e.g., ON state and OFF state).

The thresholds would not have to be precisely spaced as long as quantizer 114 is used with delta-sigma modulator 112 which can suppress the distortion that would normally result from any non-uniformity. It is quite difficult to establish and maintain a precise, uniformly space comparator set, so some means of suppressing the resulting distortion (such as a delta-sigma modulator) is preferred for high spurious free dynamic range. Further, a two sided monotonic code formed from three state bits is desired for utilization in a delta-sigma modulator in the event that plus (+) and minus (–) voltage signals are desired.

A diagram of a 4-bit monotonic folded quantizer 218 provided in the invention which uses four bits to quantize eight states is shown in FIG. 2, along with the corresponding bit output signals 220, 222, 224 and 226 thereof. LSB 220 has two states as shown, +V when the signal is positive, and –V when the signal is negative (there is no zero signal state). The other bit output signals 222–226 are generated with three states as shown: 0 V (off condition) when the signal is less than the bit's respective positive threshold or greater than the bit's respective negative threshold, +V when the bit's respective positive threshold is exceeded, and –V when the bit's respective negative threshold is exceeded (going negative). The bit-to-bit threshold relationships are not critical when used with delta-sigma modulator 112 to compensate for non-uniformity in voltage thresholds spacings. Each bit has equal weighting when combined and can be processed separately. However, since the bits (other than LSB) formed are tri-state, the zero to the positive threshold distance should be the same as the distance to the negative threshold. If quantizer 114 were to be used alone to form an ADC (i.e., not part of a delta-sigma based modulator), all threshold distances, relative to the input signal, are preferably uniformly established and maintained, or some level of distortion in the digital output will result. In general, distortion becomes more problematic as the number of bits increases, since any level mismatch becomes more significant in the lower resolution bits (LSBs). However, when quantizer 114 is used in a delta-sigma based modulator (e.g., ADC modulator 100), the in-band distortion caused by threshold mismatch is suppressed by the noise shaping characteristics of the modulator (assuming that feedback DACs 126–130 are linear).

By using amplitude folding, the same threshold pair values can be used for every bit as shown in quantizer signal diagram 228. The folding is done simply by providing different gain adjustments (G1, G2, G3, etc.) 240, 242 and 244, respectively, in the signal path 230 against a common set of +/–thresholds, to form uniformly spaced, effective threshold points over the signal as shown at 210 and 218. Although the gain adjustments need not be precise when quantizer 114 is part of a delta-sigma modulator, an automatic gain control scheme could be considered to maintain uniformity if quantizer 114 were to be used without a delta-sigma modulator 112. Since the thresholds are all the same, they can be formed by whatever means is the most accurate. For example, a full-wave rectification scheme could be used with a single threshold rather than a threshold pair to determine when the bit is to change, and then a +V or −V selection based on the polarity of the original signal can be used to select the output state. In this example, the positive and negative thresholds are matched because they are implemented as the same threshold (assuming that the full-wave ratification is near ideal and does not add distortion to the signal).

The monotonic bits formed are all equal weight and the coded value is formed by simply adding the bits (i.e., as shown by folded quantizer 218 and bit output signals 220–226, adding the bits as the waveforms are traversed from left to right (+1, +2, +3, +4, −4, −3, −2 and −1). However, it is advantageous to not have to transport and store three state bits. Fortunately, the monotonic bit structure used can be mapped to two state bits for storage and transport and then mapped back to be processed further. By observing that LSB 220 always has two states, and that the other bits only have two states relative to LSB 220, the bits can be mapped as shown by bit waveforms 254, 256, 258 and 260. That is, if LSB 220 is positive, the other bits are either OFF or positive. Likewise, if LSB 220 is negative, the other bits are either OFF or negative. OFF state bits can therefore be mapped to the opposite state from LSB 220, and recognized as such when mapping back.

The number of monotonic quantizer bits required can be generalized as ½ the number of quantizer code states. Since the binary code (two's compliment code) bits required is $\log_2(g)$, where g is number of quantizer code states, the monotonic code can provide finer resolution per bit but at the expense more bits per quantizer state set. The following table shows the comparison:

TABLE 1

Comparision between code states and two's complement and montonic bits

| States | 2s Complement Bits | Monotonic Bits |
| --- | --- | --- |
| 2 | 1 | 1 |
| 4 | 2 | 3 |
| 6 | — | 3 |
| 8 | 3 | 4 |
| 10 | — | 5 |
| 12 | — | 6 |
| 14 | — | 7 |
| 16 | 4 | 8 |
| 18 | — | 9 |
| 20 | — | 10 |
| 22 | — | 11 |
| 24 | — | 12 |
| 26 | — | 13 |
| 28 | — | 14 |
| 30 | — | 15 |
| 32 | 5 | 16 |

Figure 3A:
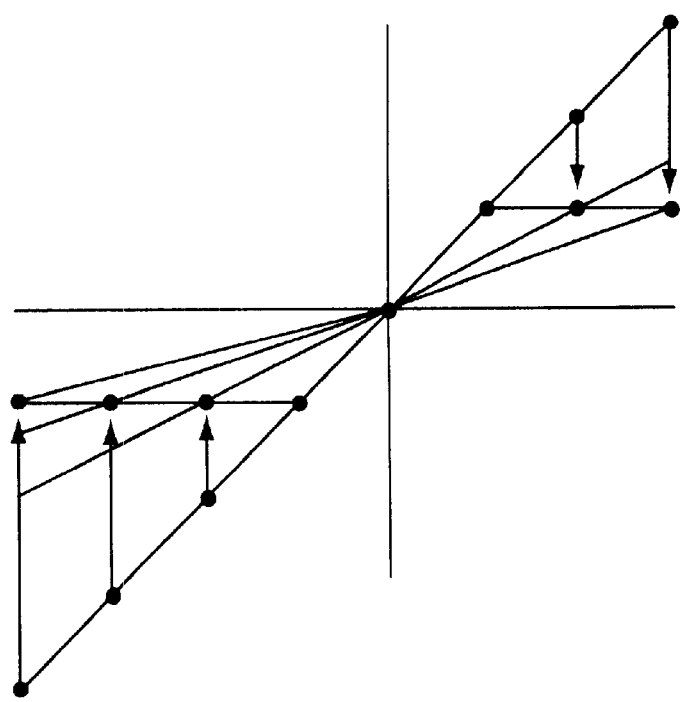
FIGS. 3A and 3B are diagrams of a variation of the folded monotonic quantizer of FIG. 2 in accordance with the present invention.
Figure 3A:
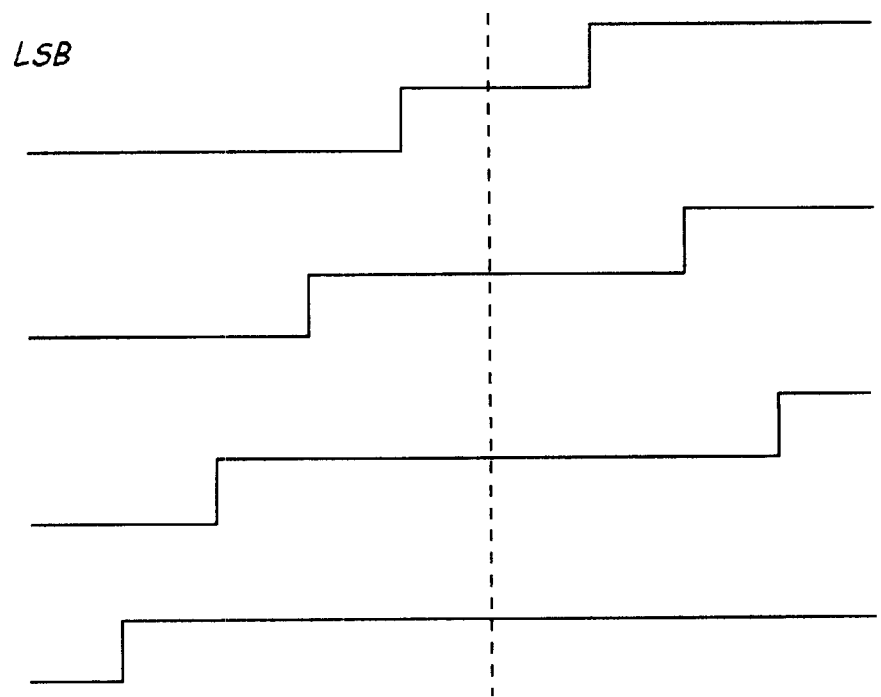
Figure 3B:
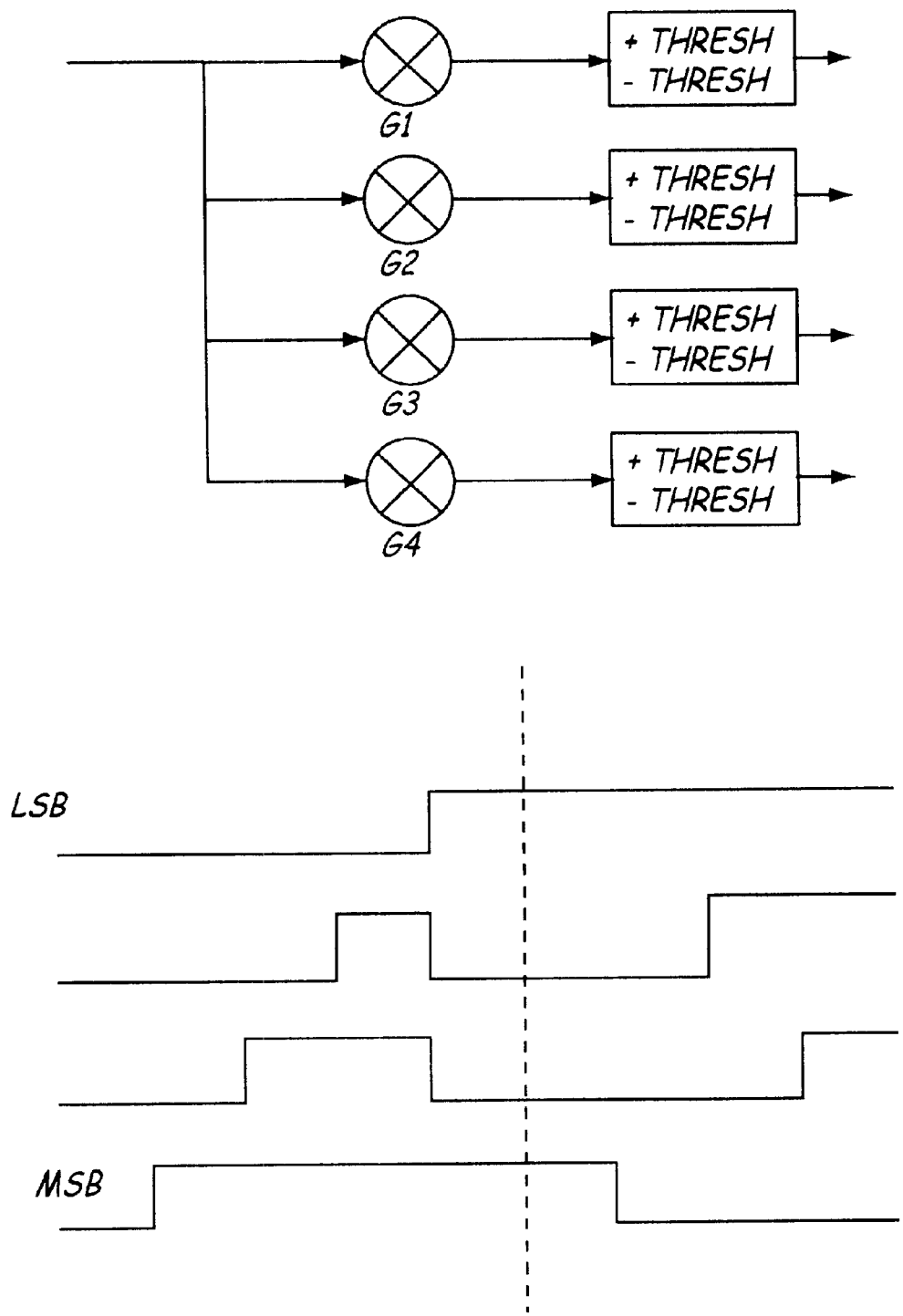

Referring now to FIGS. 3A and 3B, a variation of the folded monotonic quantizer of FIG. 2 will be discussed. The monotonic quantizer shown in FIGS. 3A and 3B is more directly mapped to two's complement than that shown in FIG. 2 and is therefore a preferable embodiment thereof. As shown in FIG. 3A, a variation of the quantizer is depicted in which the least significant bit (LSB) is also a three state bit resulting in a zero state output (0 volts) which maps directly to a two's complement zero state. Additionally, the most significant bit (MSB) has a negative (−V) state but no positive state just as two's complement has a −1 state but no +1 state (in a fractional notation). In other words, for a three bit word, −4 is represented but +4 is not. By using both MSB and LSB together, according to the following map logic, the tri-state code can be mapped to a two state per bit code as shown in FIGS. 3A and 3B.

MONOTONIC LOGIC MAPPING

FIG. 3A shows a 3-state logic system having three states: +V, 0, and −V. FIG. 3B shows a 2 state logic system having two states: +V and −V.

3-STATE TO 2-STATE CONVERSION

A 3-state signal is converted into a 2-state signal according to the following rules. If the LSB is equal to −V, then the LSB is set to −V, otherwise the LSB is set to +V. If the MSB is equal to −V, or the LSB =+V, then the MSB is set to −V, otherwise the MSB is set to +V. If the middle bit is equal to the LSB which is equal to −V, or the LSB is equal to 0, then the middle bit is set to −V, otherwise, if the middle bit is equal to the LSB which is equal to +V, then the middle bit is set to +V, otherwise if the LSB is equal to −V, then the middle bit is set to +V, otherwise, the middle bit is set to −V.

2-STATE TO 3-STATE CONVERSION

A 2-state signal is converted to a 3-state signal according to the following rules. If the LSB is equal to the MSB which is equal to +V, then the LSB is set to 0, otherwise the LSB is set to the present value of the LSB. If the LSB or the MSB is equal to +V, then the MSB is set to 0, otherwise, the MSB is set to the present value of the MSB. If the middle bit is not equal to the LSB, then the middle bit is set to 0, otherwise, the middle bit is set to the present value of the middle bit.

Figure 4:
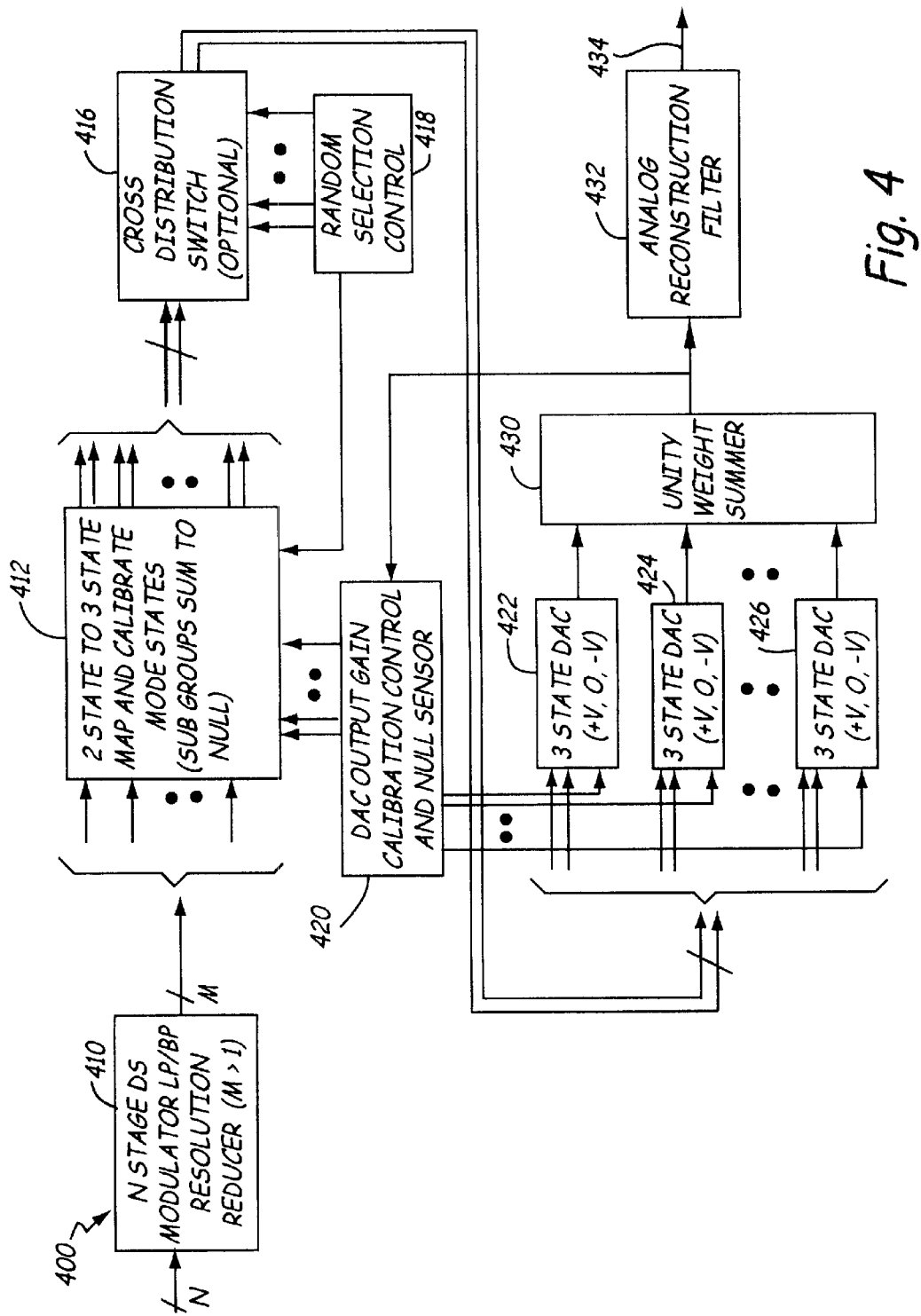
FIG. 4 is a block diagram of a multi-bit DAC in accordance with the present invention.

Referring now to FIG. 4, a multi-bit DAC in accordance with the present invention will be discussed. The concepts discussed herein with respect to the ADC modulator of FIG. 1 are also applicable to implementations of a high performance (i.e. high resolution input) digital-to-analog converter (DAC). When conventional multi-bit DACs are used as the feedback element in a high performance ADC, the performance of the DAC can be likewise improved by post processing the digital ADC data to improve its linearity and hence its spurious free dynamic range. This type of processing is dependent upon accurate characterization of the feedback DAC's transfer characteristics under all conditions and may not result in the desired spurious free dynamic range. By linearizing the DAC by the proposed method, linearity is easier to maintain in the ADC and can be equally well maintained in DAC applications as well. Since the linearization post processing technique is not feasible for a stand alone conventional DAC, predistorting the input signal might be considered to linearize the DAC output. Thus, having an accurate characterization of the conventional DAC's transfer characteristics under all conditions is required if the predistortion technique were utilized. Further, the desired spurious free dynamic range may still not be attainable.

The multi-bit DAC 400 shown in FIG. 4 includes an N-stage delta-sigma modulator 410 used to oversample and noise shape the high resolution digital data input thereby reducing the number of bits without reducing the signal to noise ratio in the signal bandwidth. The linearized approach depicted in FIG. 4 is particularly well suited for power DAC and direct digital synthesizer applications in which high spurious free dynamic range and very low noise density exists in the DAC output. These filtered analog DAC outputs could then be at radio frequency and exhibit very low intermodulation distortion, potentially enough so that multiple signal carriers can be combined in a single filtered analog DAC output to reduce duplication of transmission equipment.

Assuming that the DAC output 434 is worst case peak to peak symmetrical (i.e. two's complement −1 is not used), Table 2 shows example two's complement to tri-state bit mappings. The mappings can be determined for higher bit resolutions and for full (non-symmetrical) two's complement notation by using the equations shown below.

TABLE 2

Two's complement to tri-state bit mapping.

| 2-Bit-2's Complement to 1 Bit Tri-State Map | | 3 Bit-2's Complement to 3 Bit Tri-State Map | | 4 Bit-Two's Complement to 7 Bit Tri-State Map | |
|---|---|---|---|---|---|
| 01 | 1 | 011 | 111 | 0111 | 1111111 |
| 00 | 0 | 010 | 011 | 0110 | 0111111 |
| 11 | −1 | 001 | 001 | 0101 | 0011111 |
|  |  | 000 | 000 | 0100 | 0001111 |
|  |  | 111 | 00-1 | 0011 | 0000111 |
|  |  | 110 | 0-1-1 | 0010 | 0000011 |
|  |  | 101 | -1-1-1 | 0001 | 0000001 |
|  |  |  |  | 0000 | 0000000 |
|  |  |  |  | 1111 | 000000-1 |
|  |  |  |  | 1110 | 00000-1-1 |
|  |  |  |  | 1101 | 0000-1-1-1 |
|  |  |  |  | 1100 | 000-1-1-1-1 |
|  |  |  |  | 1011 | 00-1-1-1-1-1 |
|  |  |  |  | 1010 | 0-1-1-1-1-1-1 |
|  |  |  |  | 1001 | -1-1-1-1-1-1-1 |

For the data shown in Table 2, the data is symmetric about zero (neglecting −1of two's complement representation). With M two's complement bits in, there are P tri-state bits out where $P=(2^{(M-1)}-1)$. If the full two's complement number space is required (i.e. includes −1), then $P=(2^{(M-1)})$. Each P tri-state bit utilizes a separate 3 state DAC. As is typical with a DAC, the anolog output is filtered with a reconstruction filter to remove the sampled spectrum artifacts above the desired bandwidth. Thus, DAC 400 preferably includes a unity weight summer 430 to combine the individual component (bit) DACs and a reconstruction filter 432, and is also utilized to suppress out-of-band noise. In the event the delta-sigma modulator is a bandpass form, the signal bandwidth has shaped noise at higher and lower out-of-band frequencies. As such, reconstruction filter 432 would be a bandpass filter in the event DAC 400 is a a bandpass DAC.

It is believed that the analog-to-digital and digital-to-analog converters of the present invention and many of their attendant advantages will be understood by the foregoing description, and it will be apparent that various changes may be made in the form, construction and arrangement of the components thereof without departing from the scope and spirit of the invention or without sacrificing all of its material advantages. The forms herein before described are merely explanatory embodiments thereof. It is the intention of the following claims to encompass and include such changes.

What is claimed is:

1. An analog-to-digital converter modulator, comprising:
   means for modulating an analog input signal;
   means for quantizing an output received from said modulating means;
   means, coupled to said quantizing means, for mapping an output of said quantizing means from a three state code to a two state code;
   means, coupled to said mapping means, for delaying an output of said quantizing means; and
   means for providing a linearized feedback signal from said delaying means to said modulating means wherein an analog signal is converted to a digital signal having enhanced linearity and being represented by a predetermined number of bits.

2. An analog-to-digital converter modulator as claimed in claim 1, wherein said modulating means comprises a delta-sigma modulator.

3. An analog-to-digital converter modulator as claimed in claim 1, wherein said quantizing means is a multi-bit, amplitude folded monotonic quantizer.

4. An analog-to-digital converter modulator as claimed in claim 1, further comprising means for providing data bus rate reduction of an output signal received from said delaying means.

5. An analog-to-digital converter modulator as claimed in claim 1, said means for providing a linearized analog feedback signal comprising means, coupled to said delaying means, for mapping a two state signal to a three state signal, and one or more means, each being coupled to said two state to three state mapping means, for converting a digital signal to an analog signal, wherein one digital to analog converting means is provided per each one of the predetermined number of bits.

6. An analog-to-digital converter modulator as claimed in claim 5, further comprising means to combine at least one or more outputs of at least one or more means for converting a digital signal to an analog signal to said linearized analog feedback signal providing means.

7. An analog-to-digital converter modulator as claimed in claim 6, further comprising means for balancing relative analog output levels of each of the predetermined number of converted bits in said feedback providing means.

8. An analog-to-digital converter modulator as claimed in claim 1, further comprising means, disposed between said delaying means and said feedback providing means, for providing changed ordering of the bit input to output relationship among the predetermined number of bits.

9. An analog-to-digital converter modulator as claimed in claim 8, further comprising means, coupled with said distributing means, for randomly allocating the changed ordering among the predetermined number of bits.

10. A digital-to-analog converter modulator, comprising:
    means for modulating a digital input signal being represented by a predetermined number of bits;
    means for mapping an output of said modulating means from a two state signal to a three state signal; and
    at least one or more means for converting a three state signal output from said mapping means from a digital signal to an analog signal wherein one converting means is provided per each of the predetermined number of three state bits.

11. A digital-to-analog converter modulator as claimed in claim 10, further comprising means, disposed between said two state to three state mapping means and digital-to-analog converting means, for providing changed ordering of the bit input to output relationship among the predetermined number of bits.

12. A digital-to-analog converter modulator as claimed in claim 11, further comprising means, coupled with said distributing means, for randomly allocating the changed ordering among the predetermined number of bits.

13. A digital-to-analog converter modulator as claimed in claim 10, further comprising means for combining the analog signals provided by each of said digital to analog converting means.

14. A digital-to-analog converter modulator as claimed in claim 13, further comprising means for balancing relative analog output levels of each of the predetermined number of converted bits.

15. An analog-to-digital converter, comprising:

means for receiving an analog input signal;

means for quantizing the analog input signal into a tri-state signal at a predetermined sample rate; and means for mapping the tri-state signal into a bi-state signal whereby an output signal is provided, the output signal being represented by a predetermined number of bits.

16. An analog-to-digital converter as claimed in claim 15, further comprising means for reducing the predetermined data bus output rate of the provided output signal.

17. An analog-to-digital converter as claimed in claim 15, said quantizing means being monotonic.

18. An analog-to-digital converter as claimed in claim 15, said quantizing means being capable of providing a folded amplitude output.

19. An analog-to-digital converter as claimed in claim 15, said quantizing means being capable of providing a two's complement output.

20. An analog-to-digital converter as claimed in claim 15, said quantizing means being capable of providing uniform threshold distances relative to an input signal.

* * * * *